US 6,528,871 B1

(12) United States Patent
Tomita

(10) Patent No.: US 6,528,871 B1
(45) Date of Patent: Mar. 4, 2003

(54) STRUCTURE AND METHOD FOR MOUNTING SEMICONDUCTOR DEVICES

(75) Inventor: Yoshihiro Tomita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/497,207

(22) Filed: Feb. 3, 2000

(30) Foreign Application Priority Data

Jul. 27, 1999 (JP) ............................................. 11-212757

(51) Int. Cl.$^7$ .......................... H01L 23/34; H01L 23/48; H01L 23/02; H01L 21/44
(52) U.S. Cl. ......................... 257/686; 257/711; 257/690; 257/778; 257/776; 257/678; 257/723; 438/109
(58) Field of Search ................................. 257/723, 686, 257/690, 778, 724, 678, 776, 698, 780, 738, 685, 777; 438/109

(56) References Cited

U.S. PATENT DOCUMENTS

| 5,715,144 A | * | 2/1998 | Ameen et al. ............... 361/790 |
| 5,852,871 A | * | 12/1998 | Khandros .................... 29/843 |
| 5,977,640 A | * | 11/1999 | Bertin et al. ................. 257/777 |
| 5,998,860 A | * | 12/1999 | Chan et al. .................. 257/679 |
| 5,998,865 A | * | 12/1999 | Akram ........................ 257/723 |
| 6,060,772 A | * | 5/2000 | Sugawara et al. .......... 257/678 |
| 6,100,593 A | * | 8/2000 | Yu et al. ...................... 257/777 |
| 6,150,724 A | * | 11/2000 | Wenzel et al. ............... 257/777 |
| 6,154,370 A | * | 11/2000 | Degani et al. ............... 361/761 |
| 6,181,011 B1 | * | 1/2001 | Rostoker et al. ............ 257/758 |
| 6,222,265 B1 | * | 4/2001 | Akram et al. ............... 257/723 |
| 6,281,042 B1 | * | 8/2001 | Ahn et al. .................... 438/108 |
| 6,300,163 B1 | * | 10/2001 | Akram ........................ 438/108 |
| 6,329,713 B1 | * | 12/2001 | Farquhar et al. ............ 257/712 |
| 6,373,131 B1 | * | 4/2002 | Karnezos ..................... 257/712 |
| 6,407,456 B1 | * | 6/2002 | Ball ............................. 257/777 |
| 6,424,034 B1 | * | 7/2002 | Ahn et al. .................... 257/723 |

FOREIGN PATENT DOCUMENTS

| JP | 406097344 A | * | 4/1994 |
| JP | 406151700 A | * | 5/1994 |
| JP | 406188333 A | * | 7/1994 |
| JP | 406209068 A | * | 7/1994 |
| JP | 406232303 A | * | 8/1994 |
| JP | 8-186196 | | 7/1996 |

* cited by examiner

Primary Examiner—Matthew Smith
Assistant Examiner—Chuong A Luu
(74) Attorney, Agent, or Firm—McDermott, Will & Emery

(57) ABSTRACT

A structure and method of mounting semiconductor devices which can cope with miniaturization and high-speed transmission by embedding a semiconductor device within a wiring layer or transmission path formed between opposite sides of a substrate even when a plurality of semiconductor devices are mounted on the substrate. A semiconductor device is interposed between wiring layers or transmission paths formed on opposite sides of a substrate, thereby shortening the distance between the wiring layers and rendering a structural body compact oerall. As a result of shortening of the distance between the wiring layers, the electrical resistance value of the structural body can also be diminished. Consequently, the electrical characteristic of the mount structural body can be improved, and high-speed transmission becomes feasible. Alternatively, a semiconductor device is cylindrically formed so as to enclose a conductive wire, thereby realizing a high electrical characteristic. External terminals can be led from the entire side surface of the cylindrical structural body, thereby increasing the number of external terminals per unit mount area and rendering the structural body compact.

10 Claims, 4 Drawing Sheets

STRUCTURE AND METHOD FOR
MOUNTING SEMICONDUCTOR DEVICES

BACKGROUND OF THE INVENTION

1. Field of the Invention

The present invention relates to a structure and method for mounting semiconductor devices, and more particularly, to a structure and method for mounting semiconductor devices enclosed or interposed in a substrate.

2. Description of Related Art

FIG. 6 is a side cross-sectional view showing a conventional mount structural body equipped with semiconductor devices. In FIG. 6, reference numeral 2 designates a semiconductor element; 1 designates a circuit structural body (hereinafter referred to as a "semiconductor device"), such as a semiconductor device including the semiconductor element 2; 3 designates a conductor led out from the semiconductor element 2; 4 designates an external terminal which is electrically connected to the semiconductor element 2 by way of the conductor 3, as well as to the outside; 5 designates a substrate; 6 designates a wiring layer which is formed on opposite sides of the substrate 5 and is electrically connected to the semiconductor element 2 by way of the external element 4 and the conductor 3; 7 designates a through-hole which is formed in the substrate 5 and electrically connects the wiring layers 6 formed on the opposite sides of the substrate 5; 8 designates a resist layer which protects the wiring layers 6; and 9 designates a mount structural body comprising the elements ranging from semiconductor devices 1 to the resist layers 8. As shown in FIG. 6, in the conventional structural body 9 comprising the substrate 5 on which the plurality of semiconductor devices 1 are mounted, the plurality of semiconductor devices 1 are mounted on the substrate 5 in a side-by-side configuration.

As mentioned previously, in the conventional structural body equipped with semiconductor devices, the plurality of semiconductor devices 1 are mounted on the substrate 5 in a side-by-side configuration, thus broadening the regions for the wiring layers 6 and rendering miniaturization of the mount structural body 9 difficult. Further, such a mount structural body 9 encounters difficult in coping with high-speed transmission.

SUMMARY OF THE INVENTION

The present invention has been conceived to solve the above-described problems, and the object of the present invention is to provide a structure and method of mounting semiconductor devices which can cope with miniaturization and high-speed transmission even when a plurality of semiconductor devices are mounted on a substrate.

According to a first aspect of the present invention, there is provided a structure for mounting semiconductor devices, comprising: at least a pair of semiconductor devices; at least a pair of wiring layers connected to respective the semiconductor devices; and a substrate, on one side of which the at least a pair of wiring layers is formed and on the other side of which the other wiring layer different from the at least a pair of wiring layers is formed, wherein a semiconductor device is connected to each of the at least a pair of wiring layers and is interposed between the at least a pair of wiring layers and the the other wiring layer.

According to a second aspect of the present invention, there is provided a structure for mounting semiconductor devices, comprising: a substrate; wiring layers formed on both sides of the substrate; semiconductor devices formed so as to be connected to respective the wiring layers formed on the both sides of the substrate; and a through-hole formed in the substrate and connecting the wiring layers formed on the both sides of the substrate together, wherein in the through-hole, an interposed semiconductor device is formed so as to connect the semiconductor devices formed on respective the wiring layers formed on the both sides of the substrate.

According to a third aspect of the present invention, there is provided a structure for mounting semiconductor devices, comprising: a conductive line formed so as to be a cross section of predetermined shape; a semiconductor device formed on the conductive line using the conductive line as the core; bumps formed on the exterior peripheral surface of the semiconductor device; a wiring layer formed on the semiconductor device using the semiconductor device as the core by way of the bumps; and terminals formed on the exterior peripheral surface of the wiring layer, wherein lines connecting the conductive line to the bumps are provided within the semiconductor device.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1:
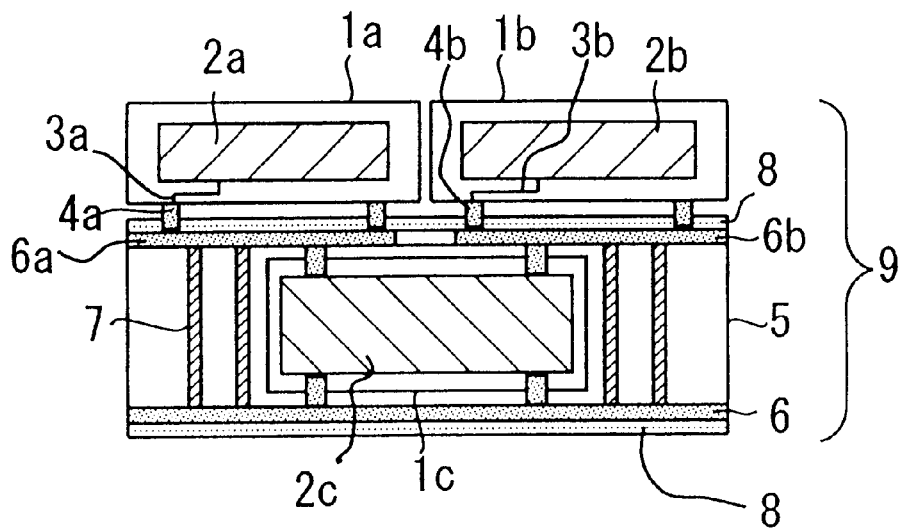
FIG. 1 is a side cross-sectional view showing a mount structural body equipped with semiconductor devices according to a embodiment 1 of the present invention.

Embodiments of the present invention will be described below with reference to the accompanying drawings. It is noted that the same reference symbols in the drawings denote the same or corresponding components.

Embodiment 1

FIG. 1 is a side cross-sectional view showing a mount structural body equipped with semiconductor devices according to a embodiment 1 of the present invention. In FIG. 1, reference numerals 2a and 2b designate semiconductor elements; 1a designates a semiconductor device including the semiconductor element 2a; 1b designates a semiconductor device including the semiconductor element 2b; 3a and 3b designate conductors led out from the respective semiconductor elements 2a and 2b; 4a designates an external terminal which is electrically connected to the semiconductor element 2a by way of the conductor 3a, as well as to the outside; 4b designates an external terminal which is electrically connected to the semiconductor element 2b by way of the conductor 3b, as well as to the outside; 5 designates a substrate; and 6, 6a, and 6b designate wiring layers or transmission paths formed on opposite sides of the substrate 5. The wiring layer 6a is electrically connected to the semiconductor element 2a by way of the external terminal 4a and the conductor 3a, and the wiring layer 6b is electrically connected to the semiconductor element 2b by way of the external terminal 4b and the conductor 3b. Further, reference numeral 7 designates a through-hole formed in the substrate 5 and electrically connects the wiring layer 6a or 6b to the wiring layer 6; 8 designates a resist layer protecting the wiring layers 6, 6a, and 6b; 9 designates a mount structural body comprising the elements ranging from the semiconductor device 1a to the resist layer 8; and 1c designates a semiconductor device which includes a semiconductor element 2c and is interposed between the upper wiring layers 6a and 6b and the lower wiring layer 6.

As shown in FIG. 1, in the present embodiment, in order to mount the plurality of semiconductor devices 1a to 1c on the substrate 5 so as to be electrically connected to the wiring layers or transmission paths 6 provided for signals on the substrate 5, the semiconductor device 1c is interposed between the upper wiring layers 6a and 6b and the lower wiring layer 6, which are formed on the opposite sides of the substrate 5. The semiconductor device 1c is connected to the semiconductor device 1a via the wiring layer 6a, as well as to the semiconductor device 1b via the wiring layer 6b, thereby coupling together the semiconductor devices 1a and 1b. As mentioned above, the structural body 9 according to the present embodiment can diminish, to about two-third, the distance between the wiring layers required in the conventional structural body (FIG. 5) comprising; e.g., three identical semiconductor devices. Thus, the present invention can render the overall structural body compact. Further, as a result of a reduction in the distance between the wiring layers, the electrical resistance of the mount structural body may also be diminished to about two-thirds in comparison with that of the conventional example (FIG. 5), thus improving electrical characteristics and enabling high-speed transmission.

Although in the embodiment 1 there is described the structure of the structural body comprising the wiring layers 6a, 6b, and 6 provided on the opposite sides of the substrate 5, no particular limitation is imposed on the number of wiring layers 6 to be formed on the substrate 5. Similarly, although only a pair of semiconductor devices are illustrated, no particular limitation is imposed on the number of semiconductor devices to be mounted on the semiconductor device, so long as at least one pair of semiconductor devices are mounted. Although in FIG. 1 the semiconductor devices 1a and 1b are shown to be mounted on the upper side of the substrate 5, they may be mounted on the lower side of the same. Further, although the semiconductor element 2a is fabricated within the semiconductor device 1a, the semiconductor element 2a may be connected directly to an external terminal or provided directly in the semiconductor element 10a.

As has been described above, according to the embodiment 1, the semiconductor device 1c is sandwiched between the wiring layers or transmission paths 6 formed on the opposite sides of the substrate 5, thus shortening the distance between the wiring layers or transmission paths and rendering the overall mount structural body 9 compact. Further, as a result of shortening of the distance between the wiring layers, the electrical resistance of the mount structural body can be diminished, thus enabling an improvement in the electrical characteristics of the mount structural body and enabling high-speed transmission.

Embodiment 2

Figure 2:
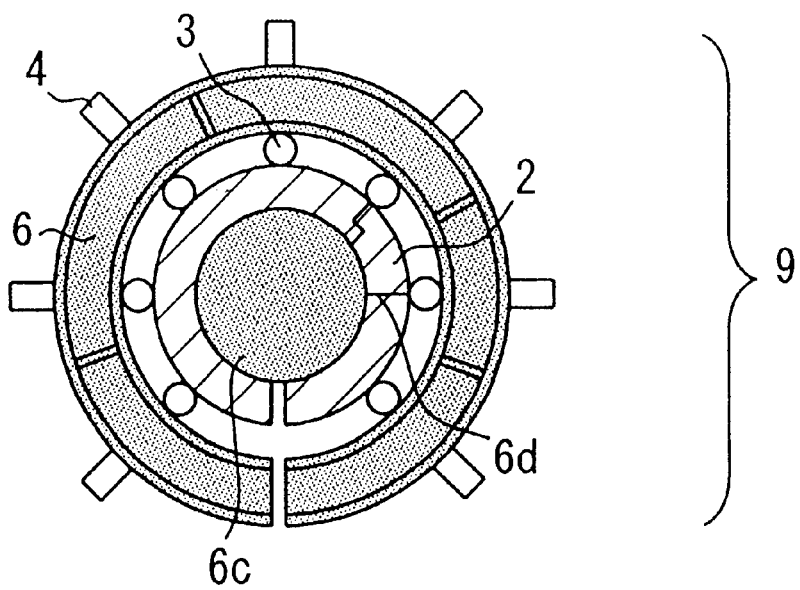
FIG. 2 is a side cross-sectional view showing a mount structural body equipped with a semiconductor device according to a embodiment 2 of the present invention.

FIG. 2 is a side cross-sectional view showing a mount structural body equipped with a semiconductor device according to a embodiment 2 of the present invention. In FIG. 2, those elements assigned the same reference numerals as those used in FIG. 1 have the same functions, and hence repetitions of their explanations are omitted. In FIG. 2, reference numeral 6c designates a conductive line provided at the center in the form of a core; e.g., a power or ground line; and 6d designates a line which is provided within a semiconductor element so as to penetrate through the semiconductor element and is electrically connected to an external terminal 4 via the conductive line 6c.

As shown in FIG. 2, the mount structural body 9 is cylindrically configured, and the conductive line 6c is placed as a core of the mount structural body 9. Further, the semiconductor element 2 is coupled by means of the wiring 6 and the conductive line 6c provided on the substrate 5 (not shown), thus yielding a decrease in electrical resistance of the mount structural body. Consequently, the semiconductor device can obtain a high electrical characteristic. Further, the external terminals 4 can be led to the outside from the entire side surface of the cylindrically-configured semiconductor device 1, thus increasing the number of external terminals per unit mount area and miniaturizing the semiconductor device 1.

Figure 3:
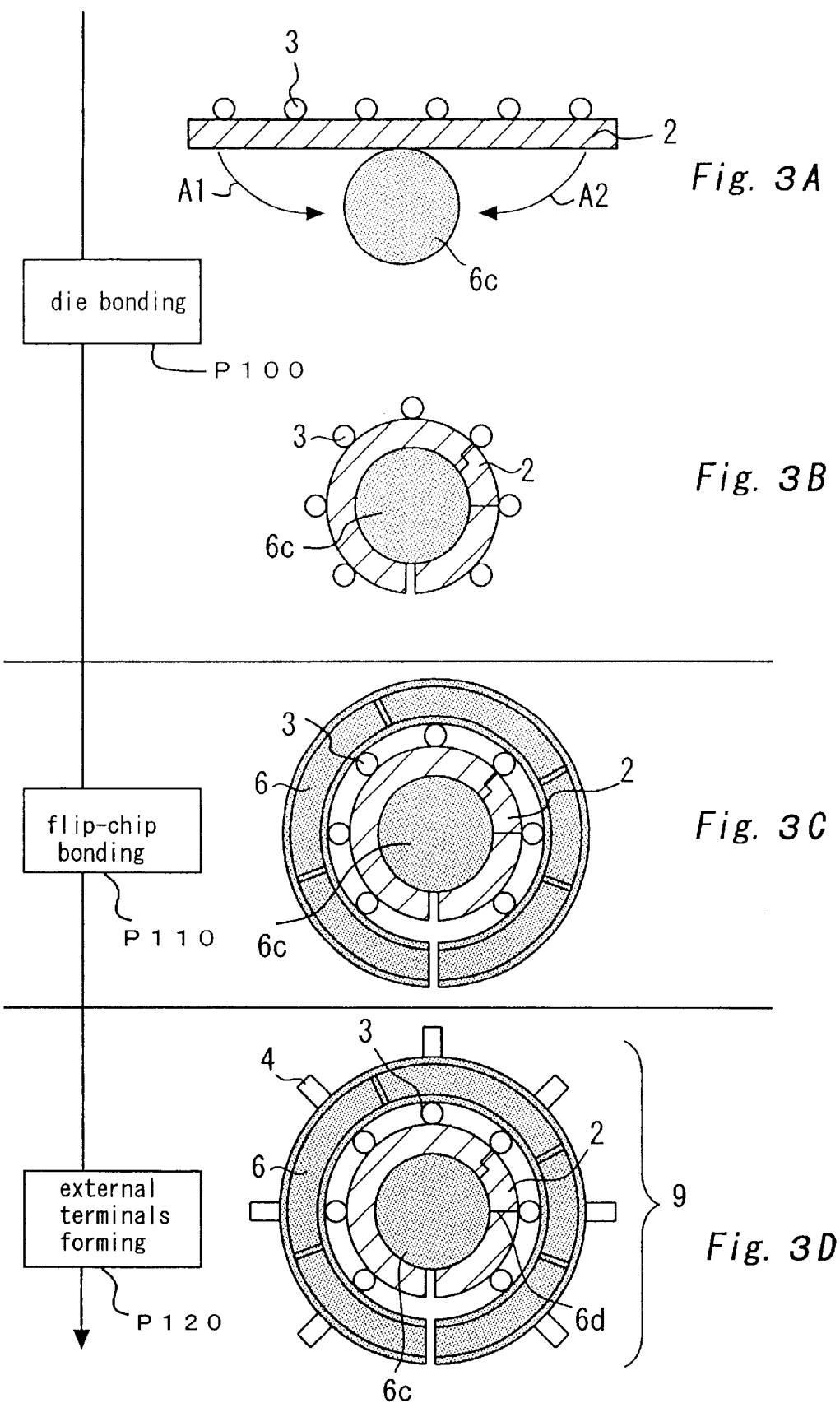
FIG. 3 is a flowchart showing a method of manufacturing the mount structural body equipped with a semiconductor device according to the embodiment 2.

FIG. 3 is a flowchart showing a method of manufacturing the mount structural body equipped with a semiconductor device according to the embodiment 2. In FIG. 3, those elements assigned the same reference numerals as those used in FIG. 1 or 2 have the same functions, and hence repetitions of their explanations are omitted here. As shown in FIG. 3A, the semiconductor element 2 having solder bumps 3 formed thereon is bent around the conductive line 6c in the directions designated by A1 and A2. As shown in FIG. 3B, the semiconductor element 2 is cylindrically bonded to the conductive line 6c serving as a core, by means of die bonding (process P100). Next, as shown in FIG. 3C, the line 6 is cylindrically bonded to the thus-cylindrically-formed semiconductor element 2, which includes the conductive line 6c as a core, by means of flip-chip bonding (process P110). Finally, as shown in FIG. 3D, the external terminals 4 are formed so as to be led from the entire side surface of the cylindrically-configured conductive line 6c (process P120). As shown in FIGS. 3A to 3D, the mount structural body 9 having the structure described in connection with the embodiment 2 can be produced through very simple manufacturing processes.

Although the embodiment 2 has described the example in which the semiconductor element 2 is cylindrically formed with the conductive line 6c serving as a core, the cross section of the semiconductor device 1 is not necessarily limited to a perfect circular shape; the cross section of the semiconductor device 1 may be formed into an oval or polygonal shape. So long as the semiconductor device 1 can envelope the semiconductor element 2, the same advantageous result as that yielded by the semiconductor device 1 having a circular shape can be yielded. The external terminals 4 can be led from the side surface of the semiconductor device 1 regardless of the profile thereof.

As mentioned above, according to the embodiment 2, the mount structural body 9 is cylindrically formed so as to include the conductive line 6c as a core, so that the semiconductor device can obtain a high electrical characteristic. Further, the external terminals 4 can be led from the entire side surface of the cylindrical mount structural body 9, thereby increasing the number of external terminals per unit mount area and rendering the mount structural body 9 compact.

Embodiment 3

Figure 4:
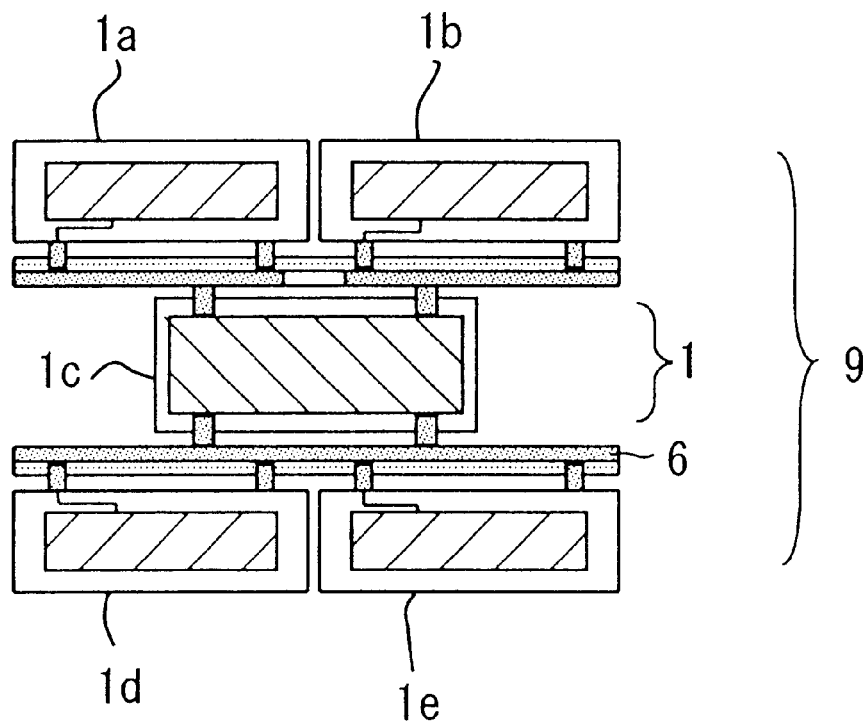
FIG. 4 is a side cross-sectional view showing a mount structural body equipped with semiconductor devices according to a embodiment 3 of the present invention.

FIG. 4 is a side cross-sectional view showing a mount structural body equipped with semiconductor devices according to a embodiment 3 of the present invention. In FIG. 4, those elements assigned the same reference numerals as those used in FIGS. 1 through 3D have the same functions, and hence repetitions of their explanations are omitted here.

As shown in FIG. 4, in addition to the semiconductor devices 1a, 1b, and 1c described in connection with the embodiment 1, semiconductor devices 1d and 1e are mounted on the wiring layer 6. By way of the semiconductor device 1c embedded in the substrate 5, the semiconductor devices 1a and 1b mounted on one side of the substrate 5 and the semiconductor devices 1d and 1e mounted on the other side of the same are electrically connected. As a result, the mount structural body 9 equipped with the plurality of semiconductor devices 1 can be made more compact than the mount structural body 9 according to the embodiment 1. Consequently, the distance between the lines of the semiconductor devices 1 can be shortened, thus enabling the entire mount structural body 9 to perform high-speed transmission.

In the embodiment 3, the semiconductor device pair including the semiconductor devices 1a and 1b mounted on one side of the substrate 5 are stacked on and electrically connected to another semiconductor device pair including the semiconductor devices 1d and 1e mounted on the other side of the same, by way of the single semiconductor device 1c embedded in the substrate 5. No limitation is imposed on the number of semiconductor devices to be combined together.

In the embodiment 3, the semiconductor device pair including the semiconductor devices 1a and 1b mounted on one side of the substrate 5 are stacked on and electrically connected to another semiconductor device pair including the semiconductor devices 1d and 1e mounted on the other side of the same, by way of the single semiconductor device 1c embedded in the substrate 5. The mount structural body 9 according to the embodiment 3, which comprises the semiconductor devices in greater number than in the case of the mount structural body 9 according to the embodiment 1, can be miniaturized. Consequently, the distance among the semiconductor devices 1 can be shortened, thus enabling the mount structural body 9 to perform high-speed transmission.

Embodiment 4

Figure 5:
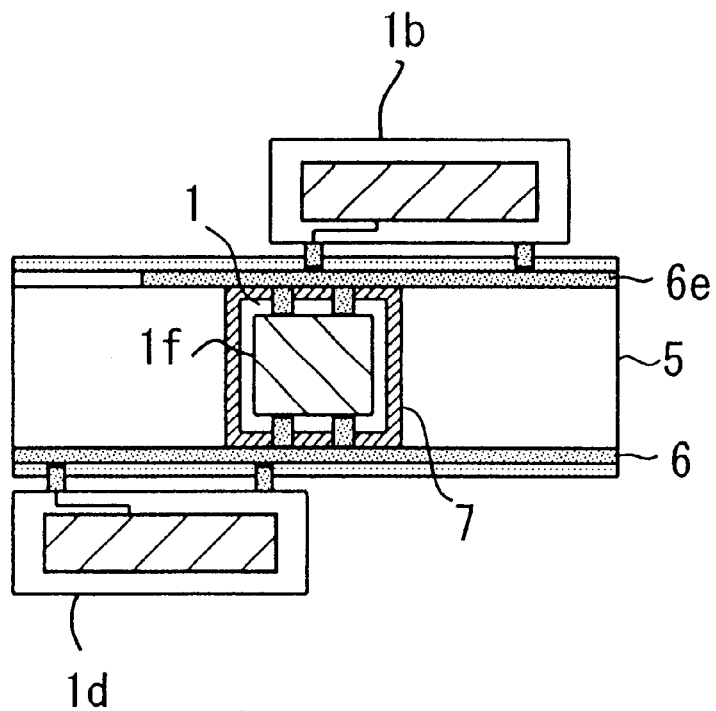
FIG. 5 is a side cross-sectional view showing a mount structural body equipped with semiconductor devices according to a embodiment 4 of the present invention.
Figure 6:
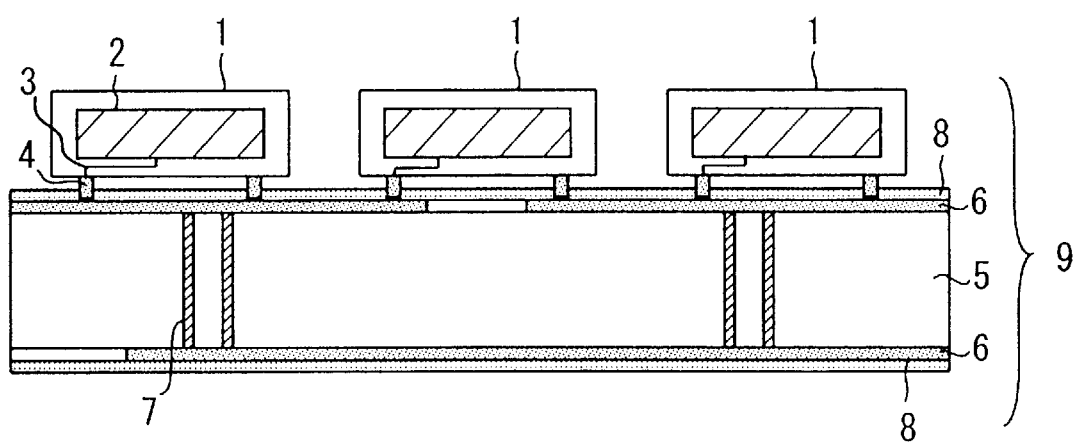
FIG. 6 is a side cross-sectional view showing a conventional mount structural body equipped with semiconductor devices.

FIG. 5 is a side cross-sectional view showing a mount structural body equipped with semiconductor devices according to a embodiment 4 of the present invention. In FIG. 5, those elements assigned the same reference numerals as those used in FIGS. 1 through 4 have the same functions, and hence repetitions of their explanations are omitted.

In the embodiment 1, the semiconductor device 1c is embedded in the substrate 5 between the wiring layers or transmission paths 6. In contrast, in the embodiment 4, a through-hole 7 is formed so as to electrically connect a wiring layer 6e provided on one side of the substrate 5 to the wiring layer 6 provided on the other side of the substrate 5, and a semiconductor device 1f is embedded in the through-hole 7. The semiconductor device 1b provided on the wiring layer 6e is connected to the semiconductor device 1d provided on the wiring layer 6 by means of the semiconductor device if. Consequently, the substrate 5 can be made compact overall, which in turn contributes to a reduction in the overall size of the mount structural body 9.

Although the embodiment 4 has described the case where the two semiconductor devices 1b and 1d are connected together by way of the single through-hole 7, no particular limitations are imposed on the number of semiconductor devices and wiring layers.

As mentioned above, according to the embodiment 4, the semiconductor device if is embedded in the through-hole 7, so that the substrate 5 can be made compact overall, which in turn renders the entire mount structural body 9 compact overall.

As has been described above, the present invention can provide a structure and method of mounting semiconductor devices which can cope with miniaturization and high-speed transmission by embedding a semiconductor device within a wiring layer or transmission path formed between opposite sides of a substrate even when a plurality of semiconductor devices are mounted on the substrate.

Here, the structure may further comprise at least a pair of semiconductor devices connected to the interposed semiconductor device on the other side of the substrate.

In the structure, the cross section of predetermined shape may be a circular shape.

In the structure, the wiring layer may have a multi-layered structure.

According to a fourth aspect of the present invention, there is provided a method of mounting semiconductor devices, comprising the steps of: forming bumps on one side of the semiconductor device; die bonding the semiconductor device where the bumps are formed on one side of the semiconductor device, to a conductive line having cross section of predetermined shape, using the conductive line as the core; forming a wiring layer, using the die bonded semiconductor device as the core, by way of the bumps formed on the semiconductor device, and forming terminals on the exterior peripheral surface of the wiring layer, wherein lines connecting the conductive line to the bumps are provided within the semiconductor device.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 11-212757 filed on Jul. 27, 1999 including specification, claims, drawings and summary are incorporated herein by reference in its entirety.

What is claimed is:

1. A structure for mounting semiconductor devices, comprising:

a substrate at least two semiconductor devices;

at least two wiring layers respectively connected to said semiconductor devices, said at least two wiring layers formed on one side of said substrate;

an other wiring layer different from said at least two wiring layers is formed on an other side of said substrate; and an other semiconductor device is directly connected to each of said at least two wiring layers and is interposed between said at least two wiring layers and said other wiring layer.

2. The structure according to claim 1, further comprising at least a pair of semiconductor devices connected to said interposed semiconductor device on the other side of said substrate.

3. The structure according to claim 2, wherein said wiring layer has a multi-layered structure.

4. The structure according to claim 1, wherein said wiring layer has a multi-layered structure.

5. A structure for mounting semiconductor devices, comprising:

a substrate;

wiring layers formed on both sides of said substrate;

semiconductor devices formed so as to be connected to respective said wiring layers formed on the both sides of said substrate; and a through-hole formed in said substrate and connecting said wiring layers formed on the both sides of said substrate together, wherein in said through-hole, an interposed semiconductor device is formed so as to connect the semiconductor devices formed on respective said wiring layers formed on the both sides of said substrate.

6. The structure according to claim 5, wherein said wiring layer has a multi-layered structure.

7. The structure for mounting semiconductor devices, comprising:

a conductive line;

a semiconductor device formed on said conductive line using said conductive line as a core of the semiconductor device;

bumps formed on the exterior peripheral surface of said semiconductor device away from the conductive line;

a wiring layer formed on said semiconductor device with said bumps therebetween;

terminals formed on the exterior peripheral surface of said wiring layer; and lines connecting said conductive line to said bumps, and said lines are provided within said semiconductor device.

8. The structure according to claim 7, wherein a cross section of said conductive line is a circular shape.

9. The structure according to claim 8, wherein said wiring layer has a multi-layered structure.

10. The structure according to claim 7, wherein said wiring layer has a multi-layered structure.

* * * * *